(12) United States Patent
Kikuchi et al.

(10) Patent No.: US 9,479,119 B2
(45) Date of Patent: Oct. 25, 2016

(54) AMPLIFIER CIRCUIT AND OPERATION METHOD THEREOF

(71) Applicant: Samsung Electronics Co., Ltd., Gyeonggi-do (KR)

(72) Inventors: Hiroyoshi Kikuchi, Kanagawa (JP); Kazuhiro Ueda, Kanagawa (JP)

(73) Assignee: Samsung Electronics Co., Ltd, Suwon-si (KR)

( * ) Notice: Subject to any disclaimer, the term of this patent is extended or adjusted under 35 U.S.C. 154(b) by 0 days.

(21) Appl. No.: 14/650,259

(22) PCT Filed: Nov. 8, 2013

(86) PCT No.: PCT/KR2013/010130
§ 371 (c)(1),
(2) Date: Jun. 5, 2015

(87) PCT Pub. No.: WO2014/088223
PCT Pub. Date: Jun. 12, 2014

(65) Prior Publication Data
US 2015/0311869 A1    Oct. 29, 2015

(30) Foreign Application Priority Data

Dec. 7, 2012 (JP) .................................. 2012-268706
Oct. 31, 2013 (KR) ........................ 10-2013-0131264

(51) Int. Cl.
*H04L 25/03* (2006.01)
*H03F 1/02* (2006.01)
(Continued)

(52) U.S. Cl.
CPC .............. *H03F 1/0288* (2013.01); *H03F 1/56* (2013.01); *H03F 3/19* (2013.01); *H03F 3/211* (2013.01);
(Continued)

(58) Field of Classification Search
CPC ........ H03F 1/0288; H03F 1/56; H03F 3/211; H03F 3/19; H03F 200/102; H03F 2200/154; H03F 2203/21106; H03F 2200/102; H03F 3/245; H04B 2001/0408; H04B 1/0475; H04L 25/0278
See application file for complete search history.

(56) References Cited

U.S. PATENT DOCUMENTS

2004/0051584 A1* 3/2004 Choi ........................ H03F 1/302
330/129
2005/0012547 A1* 1/2005 Kwon ................... H03F 1/0205
330/124 R
(Continued)

FOREIGN PATENT DOCUMENTS

JP       2010-050611     3/2010
KR   10-2011-0037033    4/2011

OTHER PUBLICATIONS

"A New Series Type Doherty Amplifier for Miniaturization", by Joomin Jung etc. 2005.*
International Search Report dated Feb. 19, 2014 in connection with International Patent Application No. PCT/KR2013/010130, 3 pages.
Written Opinion of the International Searching Authority dated Feb. 19, 2014 in connection with International Patent Application No. PCT/KR2013/010130, 4 pages.

*Primary Examiner* — Syed Haider

(57) ABSTRACT

Disclosed is an amplifier circuit capable of achieving high efficiency at back off power while maintaining high output power when an amplifier of a driving stage is saturated in a multistage amplifier in which a plurality of amplifiers are connected in series to each other. In the amplifier circuit, at least two amplifiers including a first amplifier and a second amplifier, the first amplifier preceding the second the first amplifier, are connected in series to each other, the second amplifier changes input impedance according to output power from the first amplifier, and an impedance adjusting unit for adjusting output load impedance of the first amplifier is disposed between the first amplifier and the second amplifier, wherein the impedance adjusting unit optimizes the output load impedance of the first amplifier according to a change of input impedance of the second amplifier.

20 Claims, 4 Drawing Sheets

(51) Int. Cl.
  *H03F 3/19* (2006.01)
  *H03F 1/56* (2006.01)
  *H03F 3/21* (2006.01)
  *H04B 1/04* (2006.01)
  *H04L 25/02* (2006.01)
  *H03F 3/24* (2006.01)

(52) U.S. Cl.
  CPC ............ *H03F 3/245* (2013.01); *H04B 1/0475* (2013.01); *H04L 25/0278* (2013.01); *H03F 2200/102* (2013.01); *H03F 2200/451* (2013.01); *H03F 2203/21106* (2013.01); *H04B 2001/0408* (2013.01)

(56) References Cited

U.S. PATENT DOCUMENTS

| | | | |
|---|---|---|---|
| 2005/0242875 A1* | 11/2005 | Gurvich | H03F 1/0211 330/136 |
| 2006/0109053 A1* | 5/2006 | Kim | H03F 1/0288 330/150 |
| 2007/0142014 A1* | 6/2007 | Wilcox | H01P 1/185 455/276.1 |
| 2008/0030276 A1* | 2/2008 | Hau | H03F 1/0261 330/279 |
| 2008/0129410 A1 | 6/2008 | Fukuda et al. | |
| 2012/0218044 A1* | 8/2012 | Jeong | H03F 1/0266 330/295 |
| 2013/0149979 A1* | 6/2013 | Kimura | H03F 1/0261 455/127.2 |

* cited by examiner

AMPLIFIER CIRCUIT AND OPERATION METHOD THEREOF

CROSS-REFERENCE TO RELATED APPLICATION(S)

The present application claims priority under 35 U.S.C. §365 to International Patent Application No. PCT/KR2013/010130 filed Nov. 8, 2013, entitled "AMPLIFIER CIRCUIT AND OPERATION METHOD THEREOF", and, through International Patent Application No. PCT/KR2013/010130, to Japanese Application No. 2012-268706 filed Dec. 7, 2012 and Korean Patent Application No. 10-2013-0131264 filed Oct. 31, 2013, each of which are incorporated herein by reference into the present disclosure as if fully set forth herein.

TECHNICAL FIELD

The present disclosure relates generally to an amplifier circuit and a communication apparatus.

BACKGROUND ART

Lately, with development of high-speed, large-capacity wireless communication schemes represented by Long Term Evolution (LTE), a need for modulation signals having a great Peak to Average Power Ratio (PAPR) are increasing. Generally, in an amplifier for wireless communication, signals having a great PAPR require high consumption power, and cause deterioration of operation efficiency. In order to overcome the problems, a Doherty amplifier capable of performing high-efficient operations over a wide output range is used.

The Doherty amplifier generally includes a carrier amp and a peak amp. The carrier amp amplifies signals unconditionally, whereas the peak amp amplifies signals having higher power than specific power.

DISCLOSURE OF INVENTION

Technical Problem

When power is low, only the carrier amp biased to a class AB amplifies power, and the peak amp biased to a class C amplifies no power. When power is high, both the carrier amp and the peak amp amplify power. The Doherty amplifier can increase efficiency at back off power (average output power for modulation signals) while maintaining high maximum output power, using a change of output power impedance of the carrier amp depending on the operation state of the peak amp and power combining of the carrier amp and the peak amp.

The Doherty amplifier is widely used in wireless base stations. Lately, studies into using an amplifier based on the Doherty configuration due to its conversion to other modes in mobile terminals have been conducted. Also, studies into a broad-band Doherty amplifier are underway.

By configuring an amplifier of a final stage as a Doherty amplifier in a multistage amplifier in which a plurality of amplifiers are connected in series to each other, it is possible to achieve high efficiency at back off power while maintaining high output power upon saturation. However, when an amplifier of a final stage of a multistage amplifier is configured as a Doherty amplifier, impedance matching between the Doherty amplifier and a driving amplifier provided at a stage preceding the Doherty amplifier is done at $50_\Omega$ or at arbitrary fixed impedance (in the following description, impedance matching is done at $50_\Omega$). In this case, increasing output power upon saturation of the driving amplifier reduces efficiency at back off power, and increasing efficiency at back off power reduces output power upon saturation.

The above information is presented as background information only to assist with an understanding of the present disclosure. No determination has been made, and no assertion is made, as to whether any of the above might be applicable as prior art with regard to the present disclosure.

Solution to Problem

Aspects of the present disclosure are to address at least the above-mentioned problems and/or disadvantages and to provide at least the advantages described below. Accordingly, an aspect of the present disclosure is to provide an amplifier circuit and a communication apparatus capable of achieving high efficiency at back off power while maintaining high output power when an amplifier of a driving stage is saturated in a multistage amplifier in which a plurality of amplifiers are connected in series to each other.

In accordance with an aspect of the present disclosure, there is provided an amplifier circuit including: at least two amplifiers including a first amplifier and a second amplifier, the first amplifier preceding the second amplifier; and an impedance adjusting unit disposed between the first amplifier and the second amplifier, and configured to adjust output load impedance of the first amplifier, wherein the first amplifier and the second amplifier are connected in series to each other, the second amplifier changes input impedance according to output power from the first amplifier, and the impedance adjusting unit adjusts the output load impedance of the first amplifier according to a change of input impedance of the second amplifier.

The impedance adjusting unit may include a matching circuit configured to match the output load impedance of the first amplifier with the input impedance of the second amplifier. The impedance adjusting unit may include a phase adjusting unit configured to adjust a phase of a signal output from the matching circuit.

The second amplifier may be a Doherty amplifier.

The second amplifier may be an envelope tracking amplifier.

In accordance with another aspect of the present disclosure, there is provided an operation method of an amplifier circuit, the operation method including: at an impedance adjusting unit disposed between a first amplifier and a second amplifier wherein the first amplifier precedes the second amplifier, adjusting output load impedance of the first amplifier, wherein the first amplifier and the second amplifier are connected in series to each other, the second amplifier changes input impedance according to output power from the first amplifier, and the impedance adjusting unit adjusts output load impedance of the first amplifier according to a change of input impedance of the second amplifier.

Other aspects, advantages, and salient features of the disclosure will become apparent to those skilled in the art from the following detailed description, which, taken in conjunction with the annexed drawings, discloses exemplary embodiments of the disclosure.

BRIEF DESCRIPTION OF DRAWINGS

The above and other aspects, features and advantages of certain exemplary embodiments of the present disclosure will be more apparent from the following description taken in conjunction with the accompanying drawings, in which.

Throughout the drawings, like reference numerals will be understood to refer to like parts, components, and structures.

MODE FOR THE INVENTION

The following description with reference to the accompanying drawings is provided to assist in a comprehensive understanding of exemplary embodiments of the disclosure as defined by the claims and their equivalents. It includes various specific details to assist in that understanding, but these are to be regarded as merely exemplary. Accordingly, those of ordinary skill in the art will recognize that various changes and modifications of the embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used by the inventor to enable a clear and consistent understanding of the disclosure. Accordingly, it should be apparent to those skilled in the art that the following description of exemplary embodiments of the present disclosure is provided for illustration purposes only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the singular forms "a", "an" and "the" are intended to include the plural forms as well, unless the context clearly indicates otherwise.

Figure 1:
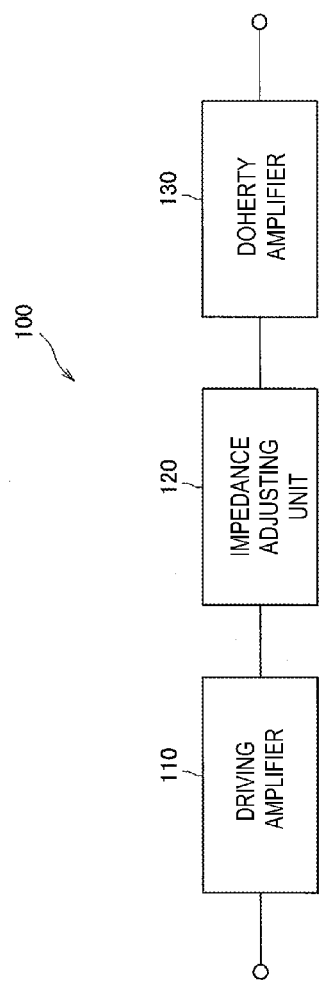
FIG. 1 is a block diagram illustrating an example of a function configuration of an amplifier circuit according to an embodiment of the present disclosure.

Hereinafter, an example of a function configuration of an amplifier according to an embodiment of the present disclosure will be described. FIG. 1 is a block diagram illustrating an example of a function configuration of an amplifier circuit according to an embodiment of the present disclosure.

Hereinafter, an example of a function configuration of an amplifier circuit according to an embodiment of the present disclosure will be described with reference to FIG. 1.

Referring to FIG. 1, an amplifier circuit 100 according to an embodiment of the present disclosure may include a driving amplifier 110, an impedance adjusting unit 120, and a Doherty amplifier 130. The driving amplifier 110 may amplify a signal received by the amplifier circuit 100. The driving amplifier 110 may transfer the amplified signal to the Doherty amplifier 130 through the impedance adjusting unit 120.

The Doherty amplifier 130 may amplify the signal transferred from the driving amplifier 110 through the impedance adjusting unit 120. The Doherty amplifier 130 may include a carrier amp and a peak amp, and a detailed configuration of the Doherty amplifier 130 will be described later. The carrier amp amplifies signals unconditionally, and the peak amp amplifies signals having higher power than predetermined power.

The amplifier circuit 100 may be a multistage amplifier in which a plurality of amplifiers are connected in series to each other. In the amplifier circuit 100, an amplifier of a final stage may be configured as the Doherty amplifier 130 as illustrated in FIG. 1. Ω when a plurality of amplifiers are connected in series to each other and an amplifier of a final stage is configured as the Doherty amplifier 130 as illustrated in FIG. 1, increasing output power upon saturation of the driving amplifier 110 reduces efficiency at back off power, and increasing efficiency at back off power reduces output power upon saturation.

This is because when impedance matching is done at 50Ω, output load impedance from the driving amplifier 110 does not properly use a change of input impedance of the Doherty amplifier 130.

Accordingly, the impedance adjusting unit 120 is disposed between the driving amplifier 110 of a driving stage and the Doherty amplifier 130 of a final stage. The impedance adjusting unit 120 may adjust output load impedance of the driving amplifier 110 matching with input impedance of the Doherty amplifier 130. More specifically, the impedance adjusting unit 120 may adjust output load impedance of the driving amplifier 110 such that high-power load matching is done when high power is output and high-efficient load matching is done at back off power.

As such, by disposing the impedance adjusting unit 120 between the driving amplifier 110 of the driving stage and the Doherty amplifier 130 of the final stage, and matching output load impedance of the driving amplifier 110 using the impedance adjusting unit 120, it is possible to achieve high efficiency at back off power while maintaining high output power upon saturation of the driving amplifier 110.

An example of a function configuration of the amplifier circuit 100 according to an embodiment of the present disclosure has been described with reference to FIG. 1. In FIG. 1, only two amplifiers of the driving amplifier 110 and the Doherty amplifier 130 are illustrated, however, the present disclosure is not limited to this. For example, according to another embodiment of the present disclosure, a plurality of amplifiers may be disposed at the driving stage, and a Doherty amplifier may be disposed at the final stage. Hereinafter, an example of a circuit configuration of the amplifier circuit 100 according to an embodiment of the present disclosure will be described.

Figure 2:
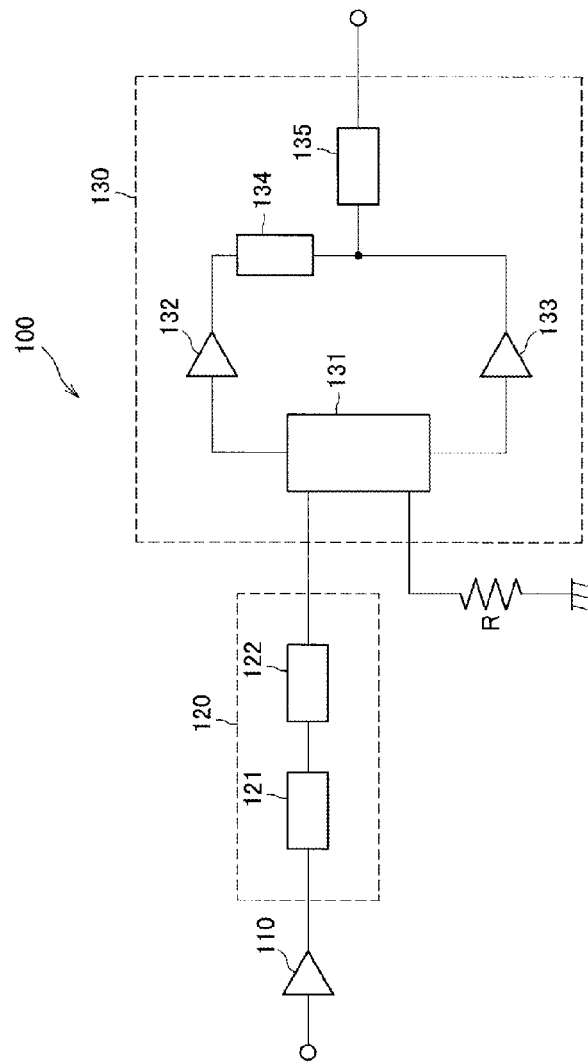
FIG. 2 is a circuit diagram illustrating an example of a circuit configuration of an amplifier circuit according to an embodiment of the present disclosure.

FIG. 2 is a circuit diagram illustrating an example of a circuit configuration of the amplifier circuit 100 according to an embodiment of the present disclosure.

Hereinafter, an example of a circuit configuration of the amplifier circuit 100 according to an embodiment of the present disclosure will be described with reference to FIG. 2.

Referring to FIG. 2, the amplifier circuit 100 may include a driving amplifier 110, an impedance adjusting unit 120, and a Doherty amplifier 130. The impedance adjusting unit 120 may include a matching circuit 121 and a phase adjusting unit 122. The Doherty amplifier 130 may include a power divider 131, a carrier amp 132, a peak amp 133, and impedance transformers 134 and 135. Power is combined at a connection of the impedance transformers 134 and 135.

The driving amplifier 110 may amplify a signal received by the amplifier circuit 100, and transfer the amplified signal to the Doherty amplifier 130 through the matching circuit 121 and the phase adjusting unit 122.

The matching circuit 121 may match impedance of the signal amplified by the driving amplifier 110 with input impedance of the Doherty amplifier 130. The matching circuit 121 may be configured as a combination of a coil and a condenser. The matching circuit 121 may transfer the signal subject to the impedance matching to the phase adjusting unit 122. The phase adjusting unit 122 may adjust the phase of the received signal, and transfer the signal whose phase has been adjusted to the power divider 131.

Input impedance of the Doherty amplifier 130 may vary depending on a magnitude of power, and output load impedance of the driving amplifier 110 may be optimized by the matching circuit 121 and the phase adjusting unit 122 according to a magnitude of power. More specifically, the matching circuit 121 and the phase adjusting unit 122 may adjust output load impedance of the driving amplifier 110 such that high-power load matching is done when high power is output from the amplifier circuit 100, and high-efficient load matching is done at back off power.

The power divider 131 may divide the signal transferred from the phase adjusting unit 122 into a first signal and a second signal, and transfer the first signal to the carrier amp 132 and the second signal to the peak amp 133.

The carrier amp 132 may amplify the first signal transferred from the power divider 131. The carrier amp 132 may be an amp biased to operate in a class B, a class AB, or a class A, and amplify the first signal unconditionally. The carrier amp 132 may transfer the amplified signal to the impedance transformer 134.

The peak amp 133 may amplify the second signal transferred from the power divider 131. The peak amp 133 is biased to operate in a class C, and may amplify the second signal when the second signal has higher power than predetermined power. The peak amp 133 may transfer the amplified second signal to the impedance transformer 135.

The impedance transformer 134 may transform impedance of the signal amplified by the carrier amp 132, and may be λ/4 transformer. The impedance transformer 134 may transfer the signal whose impedance has been transformed to the impedance transformer 135.

The impedance transformer 135 may transform impedance of the signal amplified by the peak amp 133 and impedance of the signal whose impedance has been transformed by the impedance transformer 134. The impedance transformer 135 may also be a λ/4 transformer.

The Doherty amplifier 130 may be an inverted Doherty amplifier in which a carrier amp and a peak amp are arranged at inverted positions to those illustrated in FIG. 2.

Also, the Doherty amplifier 130 may be a series-connected Doherty amplifier in which a carrier amp and a peak amp are connected in series to each other.

Hereinafter, a change of input impedance of the Doherty amplifier 130 will be described. As described above, the peak amp 133 is biased to operate in the class C, and the operation state of the peak amp 133 may vary depending on input power. Accordingly, input impedance of the Doherty amplifier 130 may greatly depend on the operation state of the peak amp 133 according to input power.

Figure 3:
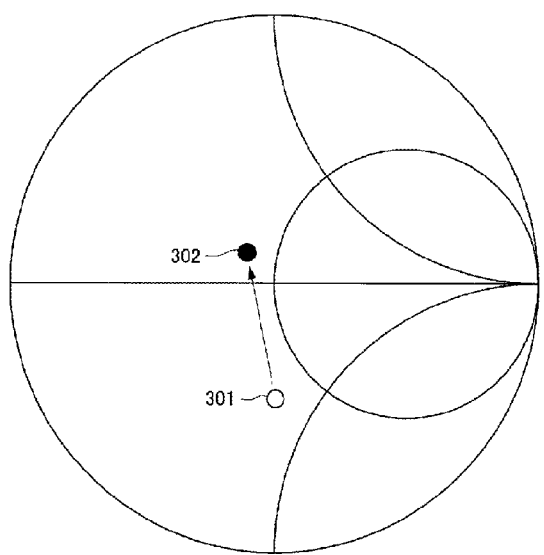
FIG. 3 is a view for describing a change of input impedance of a Doherty amplifier.

FIG. 3 is a view for describing a change of input impedance of the Doherty amplifier 130.

A point denoted by a reference number 301 in FIG. 3 represents an example of input impedance at low power, and a point denoted by a reference number 302 in FIG. 3 represents an example of input impedance at high power. As illustrated in FIG. 3, input impedance of the Doherty amplifier 130 may vary depending on the operation state of the peak amp 133 according to power input to the Doherty amplifier 130.

Figure 4:
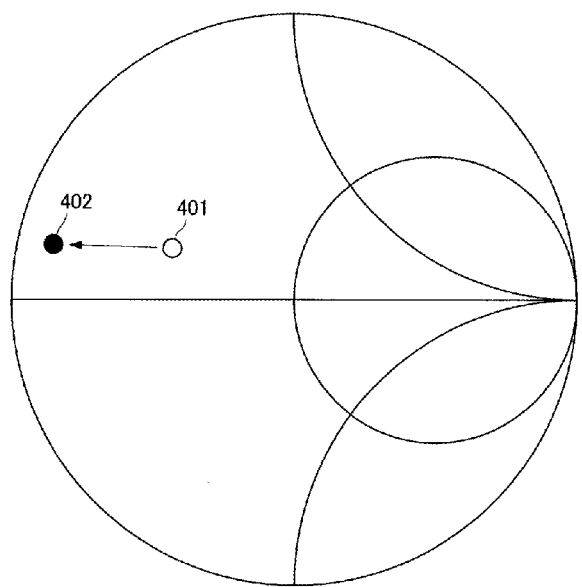
FIG. 4 is a view for describing a change of output load impedance of a driving amplifier.

FIG. 4 is a view for describing a change of output load impedance of the driving amplifier 110 by the matching circuit 121 and the phase adjusting unit 122 provided at the next stage of the driving amplifier 110.

A point denoted by a reference number 401 in FIG. 4 represents an example of output load impedance at low power, and a point denoted by a reference number 402 in FIG. 4 represents an example of output load impedance at high power.

As illustrated in FIG. 4, by optimizing the matching circuit 121 and the phase adjusting unit 122 based on a change of input impedance of the Doherty amplifier 130, output load impedance of the driving amplifier 110 may change depending on low power and high power. By changing output load impedance of the driving amplifier 110, it is possible to increase output power upon saturation of the driving amplifier 110 and to achieve high efficiency at back off power.

Also, by changing output load impedance of the driving amplifier 110 using the matching circuit 121 and the phase adjusting unit 122, the output load impedance of the driving amplifier 110 may vary according to a change in magnitude of power.

Figure 5:
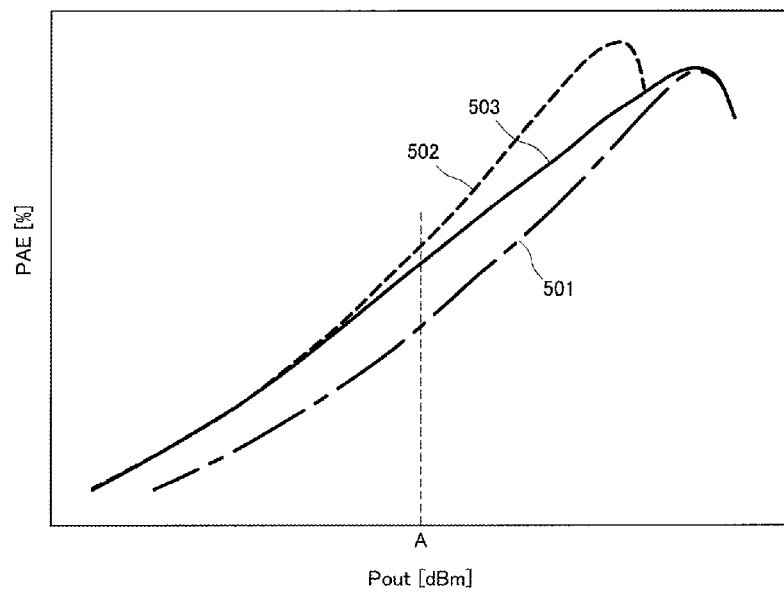
FIG. 5 is a graph showing high-frequency characteristics of a driving amplifier included in an amplifier circuit according to an embodiment of the present disclosure.

FIG. 5 is a graph showing high-frequency characteristics of the driving amplifier 110 included in the amplifier circuit 100, according to an embodiment of the present disclosure.

In the graph shown in FIG. 5, the horizontal axis represents output power Pout [dBm], and the vertical axis represents Power Added Efficiency (PAE) [%].

A reference number 501 of FIG. 5 corresponds to high-frequency characteristics of the driving amplifier 110 when impedance matching is done to increase output power upon saturation, a reference number 502 of FIG. 5 corresponds to high-frequency characteristics of the driving amplifier 110 when impedance matching is done to obtain high efficiency at back off power, and a reference number 503 of FIG. 5 corresponds to high-frequency characteristics of the driving amplifier 110 subject to impedance matching by the matching circuit 121 and the phase adjusting unit 122 provided at the next stage of the driving amplifier 110.

As shown in FIG. 5, if output load impedance of the driving amplifier 110 is adjusted by the matching circuit 121 and the phase adjusting unit 122 provided at the next stage of the driving amplifier 110, it is possible to obtain frequency characteristics capable of achieving high efficiency at back off power while increasing output power upon saturation of the driving amplifier 110.

Also, by adjusting output load impedance of the driving amplifier 110 using the matching circuit 121 and the phase adjusting unit 122 provided at the next stage of the driving amplifier 110, it is possible to reduce distortion and widen a dynamic range even when an operating point greatly wobbles. Particularly, it is preferred to increase efficiency at back off power for a modulation signal having a great PAPR, and referring to the graph shown in FIG. 5, it is required to increase efficiency at or near output power Pout of a point A. Accordingly, the amplifier circuit 100 according to the current embodiment can ensure efficient amplification particularly upon wireless transmission by a modulation signal having a great PAPR and requiring high efficiency at back off power.

Also, the amplifier circuit 100 according to the current embodiment as described above has a configuration in which a plurality of amplifiers are connected in series to each other, and an amplifier of a final stage is a Doherty amplifier, however, an amplifier of the final stage is not limited to a Doherty amplifier. That is, an amplifier of the final stage may be any other amplifier whose input impedance varies depending on power. For example, an envelope tracking amplifier may be used as an amplifier of the final stage.

The envelope tracking amplifier uses an envelope tracking method of changing a drain voltage of a Field Effect Transistor (FET) which is an amplification device of a power amplifier in synchronization with an envelope of a signal. The envelope tracking amplifier can achieve high efficiency by reducing, when a signal level is low, a drain voltage to lower peak power of the amplifier and lowering back off power. When such an envelope tracking amplifier is used as an amplifier of the final stage, the amplifier circuit 100 may obtain frequency characteristics capable of achieving high efficiency at back off power while increasing output power upon saturation of the driving amplifier 110.

Now, an example of a function configuration of a wireless base station including the amplifier circuit 100 will be described.

Figure 6:
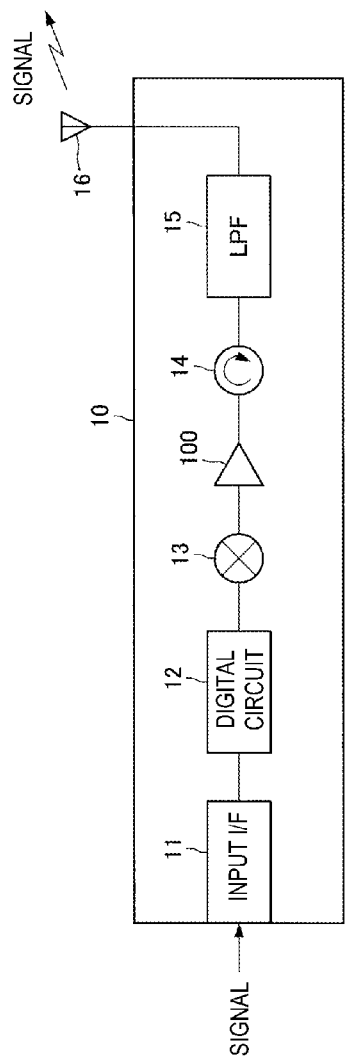
FIG. 6 is a block diagram illustrating an example of a function configuration of a communication apparatus including an amplifier circuit, according to an embodiment of the present disclosure.

FIG. 6 is a block diagram illustrating a function configuration of a wireless base station including the amplifier circuit 100, according to an embodiment of the present disclosure.

The wireless base station illustrated in FIG. 6 is an example of a communication apparatus.

Hereinafter, an example of a function configuration of a wireless base station 10 including the amplifier circuit 100, according to an embodiment of the present disclosure, will be described with reference to FIG. 6.

Referring to FIG. 6, the wireless base station 10 may include an input interface (I/F) 11, a digital circuit 12, a frequency converter 13, the amplifier circuit 100, an isolator 14, a Low-Pass Filter (LPF) 15, and an antenna 16.

The input interface 11 may be an interface for receiving signals. The input interface 11 may transfer a received signal to the digital circuit 12. The digital circuit 12 may perform digital processing on the received signal, and transfer the signal subject to the digital processing to the frequency converter 13.

The frequency converter 13 may convert the frequency of the signal received from the digital circuit 12, and transfer the signal whose frequency has been converted to the amplifier circuit 100.

The isolator 14 may perform isolation on the signal amplified by the amplifier circuit 100, and transfer the signal subject to the isolation to the LPF 15. The LPF 15 may remove a noise component from the signal received from the isolator 14. The antenna 16 may output the signal from which the noise component has been removed by the LPF 15.

By using the amplifier circuit 100 illustrated in FIG. 1 in the wireless base station 10 having the configuration illustrated in FIG. 6, the wireless base station 10 may obtain frequency characteristics capable of achieving high efficiency at back off power while increasing output power upon saturation of the driving amplifier 110.

In FIG. 6, an example of a function configuration of a wireless base station having the amplifier circuit 100, according to an embodiment of the present disclosure, is illustrated, however, the present disclosure is not limited to this example. For example, the amplifier circuit 100 may be used in a Wireless Access Point (WAP) or a mobile phone in order to obtain frequency characteristics capable of achieving high efficiency at back off power while increasing output power upon saturation of the driving amplifier 110.

As described above, according to an embodiment of the present disclosure, there is provided an amplifier capable of achieving high efficiency at back off power while maintaining high output power upon saturation of a driving amplifier in a multistage amplifier in which a plurality of amplifiers are connected in series to each other.

The amplifier circuit 100 according to the embodiment of the present disclosure may include the impedance adjusting unit 120 for adjusting output load impedance of the driving amplifier 110, between the driving amplifier 110 and the Doherty amplifier 130, as illustrated in FIG. 1. The impedance adjusting unit 120 may adjust impedance matching between the driving amplifier 110 and the Doherty amplifier 130 according to output power from the driving amplifier 110.

Since the amplifier circuit 100 can variably optimize impedance matching between the driving amplifier 110 and the Doherty amplifier 130 according to output power from the driving amplifier 110, the amplifier circuit 100 may obtain frequency characteristics capable of achieving high efficiency at back off power while increasing output power upon saturation of the driving amplifier 110, as shown in FIG. 5.

Figure 7:
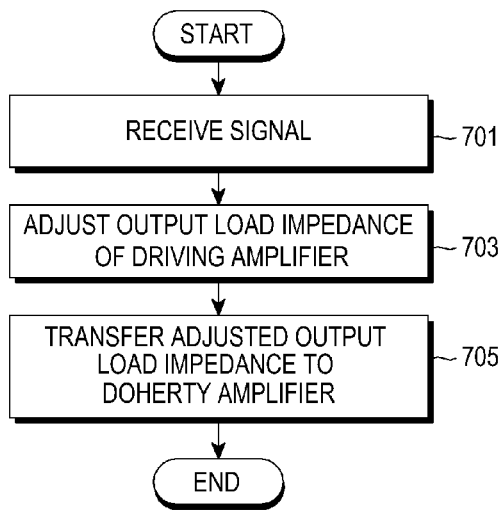
FIG. 7 is a flowchart of an operation method of an amplifier circuit, according to an embodiment of the present disclosure.

FIG. 7 is a flowchart of an operation method of the amplifier circuit 100, according to an embodiment of the present disclosure.

Referring to FIGS. 1 and 7, the impedance adjusting unit 120 may receive a signal from the driving amplifier 110, in step 701.

Then, the impedance adjusting unit 120 may adjust output load impedance of the driving amplifier 110 according to a change of input impedance of the Doherty amplifier 130, in step 703. More specifically, the impedance adjusting unit 120 may adjust output load impedance of the driving amplifier 110 such that high-power load matching is done when high power is output and high-efficient load matching is done at back off power.

Thereafter, the impedance adjusting unit 120 may transfer the adjusted output load impedance to the Doherty amplifier 130, in step 705.

Therefore, according to the embodiments of the present disclosure, there are provided an amplifier circuit and a communication apparatus capable of achieving high efficiency at back off power while maintaining high output power when an amplifier of a driving stage is saturated in a multistage amplifier in which a plurality of amplifiers are connected in series to each other.

While the disclosure has been shown and described with reference to certain exemplary embodiments thereof, it will be understood by those skilled in the art that various changes in form and details may be made therein without departing from the spirit and scope of the disclosure as defined by the appended claims and their equivalents.

The invention claimed is:

1. An amplifier circuit comprising:
    at least two amplifiers including a first amplifier and a second amplifier, the first amplifier preceding the second amplifier; and
    an impedance adjusting unit disposed between the first amplifier and the second amplifier, and configured to:
        adjust an output load impedance of the first amplifier, and
        adjust a phase of a signal output from the adjusted output load impedance,
    wherein the second amplifier is configured to change input impedance according to an output power from the first amplifier, and
    wherein the impedance adjusting unit is configured to adjust the output load impedance of the first amplifier according to a change of input impedance of the second amplifier.

2. The amplifier circuit according to claim 1, wherein the impedance adjusting unit is configured to adjust the output load impedance of the first amplifier such that high-power load matching is done based on a first amplifier outputting high power and high-efficient load matching is done based on a first amplifier outputting back-off power.

3. The amplifier circuit according to claim 1, wherein the impedance adjusting unit comprises a matching circuit configured to match the output load impedance of the first amplifier with the input impedance of the second amplifier.

4. The amplifier circuit according to claim 1, wherein the impedance adjusting unit comprises a phase adjusting unit configured to adjust a phase of a signal output from a matching circuit.

5. The amplifier circuit according to claim 1, wherein the second amplifier is a Doherty amplifier.

6. The amplifier circuit according to claim 1, wherein the second amplifier is an envelope tracking amplifier.

7. The amplifier circuit according to claim 1, wherein the amplifier circuit is included in a communication apparatus.

8. A method of operating an amplifier circuit, the method comprising:
    adjusting, at an impedance adjusting unit disposed between a first amplifier and a second amplifier, an output load impedance of the first amplifier;
    adjusting a phase of a signal output from the adjusted output load impedance;
    changing, by the second amplifier, an input impedance according to output power from the first amplifier; and
    adjusting, by the impedance adjusting unit, an output load impedance of the first amplifier according to a change of input impedance of the second amplifier,
    wherein the first amplifier precedes the second amplifier.

9. The method according to claim 8, wherein the impedance adjusting unit adjusts the output load impedance of the first amplifier such that high-power load matching is done when a first amplifier outputs high power and high-efficient load matching is done when a first amplifier outputs back off power.

10. The method according to claim 8, wherein the impedance adjusting unit comprises a matching circuit configured to match the output load impedance of the first amplifier with the input impedance of the second amplifier.

11. The method according to claim 8, wherein the impedance adjusting unit comprises a phase adjusting unit configured to adjust a phase of a signal output from a matching circuit.

12. The method according to claim 8, wherein the second amplifier is a Doherty amplifier.

13. The method according to claim 8, wherein the second amplifier is an envelope tracking amplifier.

14. The method according to claim 8, wherein the amplifier circuit is included in a communication apparatus.

15. A wireless communication apparatus comprising:
    a first amplifier;
    a second amplifier, the first amplifier preceding the second amplifier; and
    an impedance adjusting unit disposed between the first amplifier and the second amplifier, and configured to:
        adjust an output load impedance of the first amplifier, and
        adjust a phase of a signal output from the adjusted output load impedance,
    wherein the second amplifier is configured to change input impedance according to an output power from the first amplifier, and
    wherein the impedance adjusting unit is configured to adjust the output load impedance and a phase of the first amplifier according to a change of input impedance of the second amplifier.

16. The wireless communication apparatus according to claim 15, wherein the impedance adjusting unit is configured to adjust the output load impedance of the first amplifier such that high-power load matching is done based on a first amplifier outputting high power and high-efficient load matching is done based on a first amplifier outputting back-off power.

17. The wireless communication apparatus according to claim 15, wherein the impedance adjusting unit comprises a matching circuit configured to match the output load impedance of the first amplifier with the input impedance of the second amplifier.

18. The wireless communication apparatus according to claim 15, wherein the impedance adjusting unit comprises a phase adjusting unit configured to adjust a phase of a signal output from a matching circuit.

19. The wireless communication apparatus according to claim 15, wherein the second amplifier is a Doherty amplifier.

20. The wireless communication apparatus according to claim 15, wherein the second amplifier is an envelope tracking amplifier.

* * * * *